US012531473B2

(12) United States Patent
Bueno

(10) Patent No.: US 12,531,473 B2
(45) Date of Patent: Jan. 20, 2026

(54) COMPACT MULTIFUNCTIONAL FILTER

(71) Applicant: Luiz H Bueno, Recife (BR)

(72) Inventor: Luiz H Bueno, Recife (BR)

(*) Notice: Subject to any disclaimer, the term of this patent is extended or adjusted under 35 U.S.C. 154(b) by 217 days.

(21) Appl. No.: 18/239,064

(22) Filed: Aug. 28, 2023

(65) Prior Publication Data

US 2025/0079972 A1   Mar. 6, 2025

(51) Int. Cl.
*H02M 1/12* (2006.01)
*H03H 7/06* (2006.01)
*H03H 11/48* (2006.01)

(52) U.S. Cl.
CPC .............. *H02M 1/12* (2013.01); *H02M 1/126* (2013.01); *H03H 7/06* (2013.01); *H03H 11/481* (2013.01)

(58) Field of Classification Search
CPC .......... H02M 1/12; H02M 1/126; H03H 7/06; H03H 11/481
See application file for complete search history.

(56) References Cited

U.S. PATENT DOCUMENTS

2016/0329714 A1*  11/2016  Li .................... H02M 1/42
2025/0055435 A1*  2/2025   Tucker ............. H01F 27/28

* cited by examiner

*Primary Examiner* — Jue Zhang
(74) *Attorney, Agent, or Firm* — Christopher J. Vandam PA; Chris Van Dam

(57) ABSTRACT

An electronic filter with passive and active filters installed in parallel on an electrical network. The passive filter attenuates an unwanted harmonic on the network. The active filter detects remaining unwanted harmonic and generates a sinusoidal signal introduced to the network to cancel remaining harmonic.

4 Claims, 5 Drawing Sheets

COMPACT MULTIFUNCTIONAL FILTER

CROSS-REFERENCES TO RELATED APPLICATIONS

None.

STATEMENT REGARDING FEDERAL SPONSORED RESEARCH OR DEVELOPMENT

None.

NAMES OF PARTIES TO A JOINT RESEARCH AGREEMENT

None.

REFERENCE TO A "SEQUENCE LISTING", A TABLE, OR A COMPUTER PROGRAM LISTING APPENDIX SUBMITTED ON COMPACT DISC AND INCORPORATION-BY-REFERENCE OF THE MATERIAL ON THE COMPACT DISCLOSURE

None.

STATEMENT REGARDING PRIOR DISCLOSURES BY AN INVENTOR OR JOINT INVENTOR

None.

BACKGROUND OF THE INVENTION

1. Field of the Invention

The present invention relates to electronic circuits and more particularly to load balancing multifunctional filter.

2. Description of Related Art Including Information Disclosed Under 37 CFR 1.97 and 37 CFR 1.98

The prior art has filed to solve the issues of attenuating false electrical currents and unbalanced electrical loads, attenuating harmful harmonics for electrical systems and reducing total harmonic distortion (THD).

Several designs for filter circuits have been designed in the past. None of them, however, includes a design where the parallel active filter and the parallel passive filter work together to attenuate the voltages whereby the harmonics in the electrical network reduce the THD (total harmonic distortion), while the varistors function as surge protection devices, protecting electronic equipment from voltage surges.

Other patents describing the closest subject matter provide for a number of more or less complicated features that fail to solve the problem in an efficient and economical way. None of these patents suggest the novel features of the present invention.

A brief abstract of the technical disclosure in the specification and title are provided as well for the purposes of complying with 37 CFR 1.72 and are not intended to be used for interpreting or limiting the scope of the claims.

Without limiting the scope of the invention, a brief summary of some of the claimed embodiments of the invention is set forth below. Additional details of the summarized embodiments of the invention and/or additional embodiments of the invention may be found in the detailed description of the invention below.

BRIEF SUMMARY OF THE INVENTION

It is one of the main objects of the present invention to provide a circuit that attenuates false electrical currents and unbalanced electrical loads.

It is another object of this invention to provide a circuit that attenuates harmful harmonics for electrical systems.

It is still another object of the present invention to provide a circuit that and reducing total harmonic distortion (THD).

It is yet another object of this invention to provide such a device that is inexpensive to manufacture and maintain while retaining its effectiveness.

Further objects of the invention will be brought out in the following part of the specification, wherein detailed description is for the purpose of fully disclosing the invention without placing limitations thereon.

These and other embodiments which characterize the invention are pointed out with particularity in the claims annexed hereto and forming a part hereof. However, for a better understanding of the invention, its advantages and objectives obtained by its use, reference can be made to the drawings which form a further part hereof and the accompanying descriptive matter, in which there are illustrated and described various embodiments of the invention.

BRIEF DESCRIPTION OF THE SEVERAL VIEWS OF THE DRAWINGS

With the above and other related objects in view, the invention exists in the details of construction and combination of parts as will be more fully understood from the following description, when read in conjunction with the accompanying drawings in which.

DETAILED DESCRIPTION OF THE INVENTION

Figure 1:
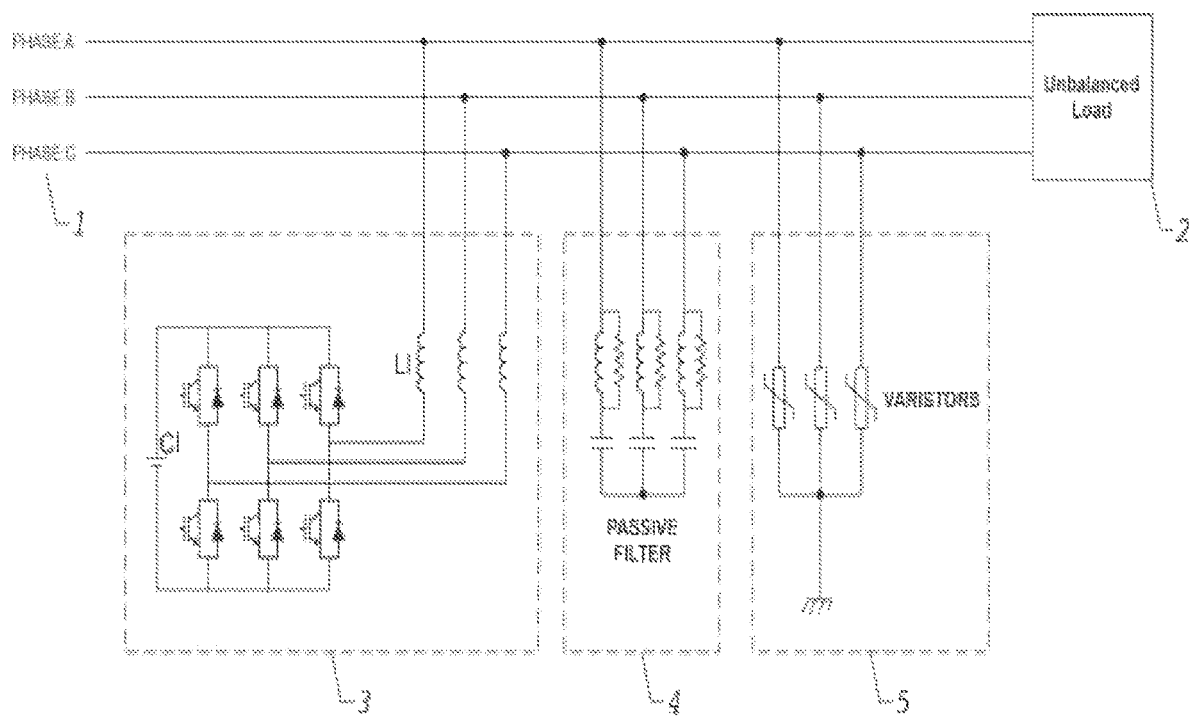
FIG. 1 shows a circuit diagram of a version of a compact multifunctional filter assembly.

While this invention may be embodied in many different forms, there are described in detail herein specific embodiments of the invention. This description is exemplary of the principles of the invention and is not intended to limit the invention to the particular embodiments illustrated and described.

For the purpose of this disclosure, like reference numerals in the figures shall refer to like features unless otherwise indicated or is obvious by context.

The subject device and method of use is sometimes referred to as the device, the invention, the compact multifunctional filter, the multifunctional electrical filter, the multifunctional compact filter, the filter, the circuit, the machine or other similar terms. These terms may be used interchangeably as context requires and from use the intent becomes apparent. The masculine can sometimes refer to the feminine and neuter and vice versa. The plural may include the singular and singular the plural as appropriate from a fair and reasonable interpretation in the situation.

Interference is highly detrimental to the full functioning of electronic equipment. Generally, the capacitive filter is installed in parallel to the mains, and avoids interfering with the installed power of the single-line system of each plant. It is also capable of selectively canceling the impedance between the mains and the ground for frequencies other than 60 HZ, The frequency variations are selectively stabilized, keeping the fundamental wave as stable as possible at the 60 HZ frequency. It thereby avoids the increase of electric power consumption (heat generation) of all electronic equipment, reducing its useful life and stopping or instantaneous burning of equipment.

The present compact filter is installed after the consumption meters, in parallel to the system and connected to the main switch, panels and electrical distribution boards, being necessary the perfect grounding of the installation following norms and standards defined by the factory.

One of the main distinguishing characteristics of this invention is that it is a compact and low-cost device, which allows its installation close to any unbalanced load, in order to increase its efficiency. This solution overcomes the limitations of conventional systems, offering an effective solution for improving the quality of electrical energy.

With its innovative design and precise control algorithm, the VSI filter system can reduce harmonic disturbances and minimize voltage variations, ensuring a more stable and reliable power supply. Its wide range of applications and benefits make it an essential component to improve energy efficiency and protect electronic equipment in different sectors of society.

The parallel active filter (FAP) and the parallel passive filter (RLC) work together to attenuate voltages, the harmonics in the electrical network and reduce the THD (total harmonic distortion), while the varistors are intended to function as surge protection devices, protecting electronic equipment from voltage surges up to 680 Vac.

The example of the exemplary version of the filter shown in the drawings is designed to operate at loads of up to 55 HP. For larger loads it will be necessary to use more devices parallel to the load.

Referring now to the drawings, where the present invention is generally referred to in the drawings, it can be observed that it basically includes an electrical network 1, an unbalanced load 2, a parallel active filter (FAP) 3, a parallel passive filter (RLC) 4, varistors 5, current sensors 6, digital signal processor (DSP) 7, insulated gate bipolar transistors (IGBT) 8, inductive filter 9, element 10, synchronization method 11, pulse width modulator (PWM) 12, drives 13, switch 14, element 15, element 16 and high pass filter 17.

The device can be fairly generalized as an electronic device that performs as a compact multifunctional filter. It is ideal for use in electrical networks with unbalanced loads. It is aimed at attenuating false electrical currents and unbalanced electrical loads. It also attenuates harmful harmonics for electrical systems and reducing total harmonic distortion (THD), which cause losses and affect the quality of circulating electricity. The compact multifunctional filter also protects motors and electronics from sudden oscillations of up to 680 Vac. This is important in places with unstable electrical networks.

In one embodiment the compact multifunctional filter is installed parallel to the electrical network. It is built in a compact and modular way, generally being installed directly at the source of the problem. This allows that an electrical system can have several devices (loads) installed parallel to the electrical network, close to unbalanced loads, aiming at more efficiency and ease of installation.

Looking at FIG. 1, the device is composed of a parallel passive filter (RLC) 4, a parallel active filter (FAP) 3 and a set of varistors 5. All circuits are connected in parallel to the electrical network 1 and close to the unbalanced load 2.

Figure 2:
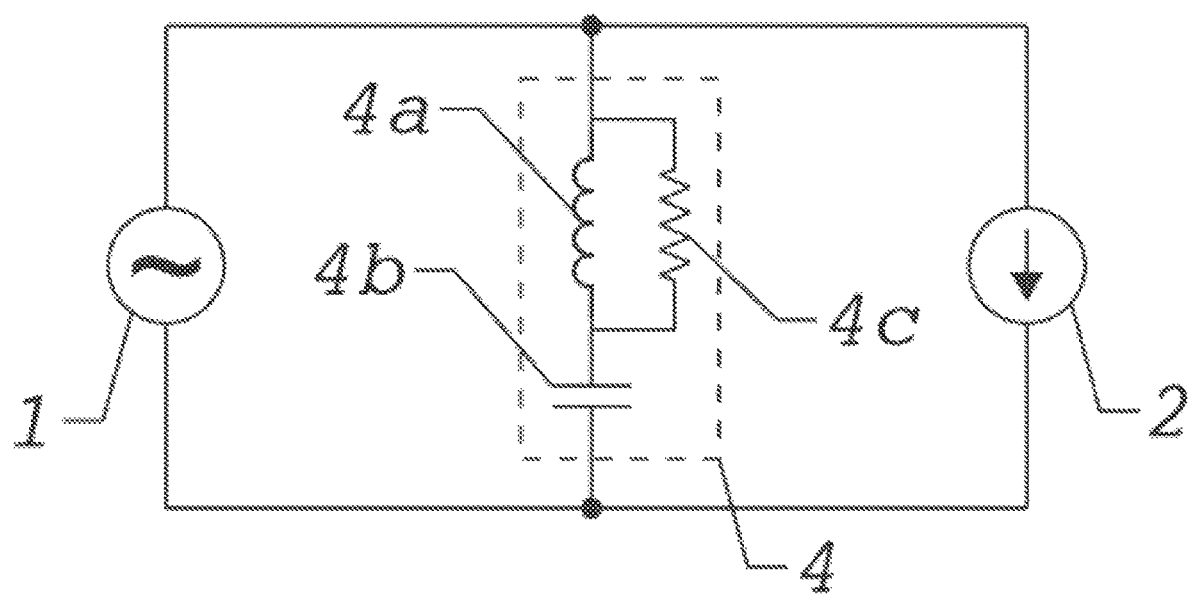
FIG. 2 shows a circuit diagram of a version of a parallel passive filter sub-assembly.

Looking now particularly at FIG. 2, a parallel passive filter is shown in more detail. The parallel passive filter 4 is designed to operate in a pass range. It is composed of a capacitor 4b, a resistor 4c and an inductor 4a, sized to attenuate the unwanted harmonics present in the electrical network, covering the range from the 2nd to the 19th order (60 to 1140 Hz). The passive filter diverts the harmonics in order to reduce them in the electrical network. It is installed parallel to the electrical network 1 and to the load 2, providing harmonic attenuation.

Figure 3:
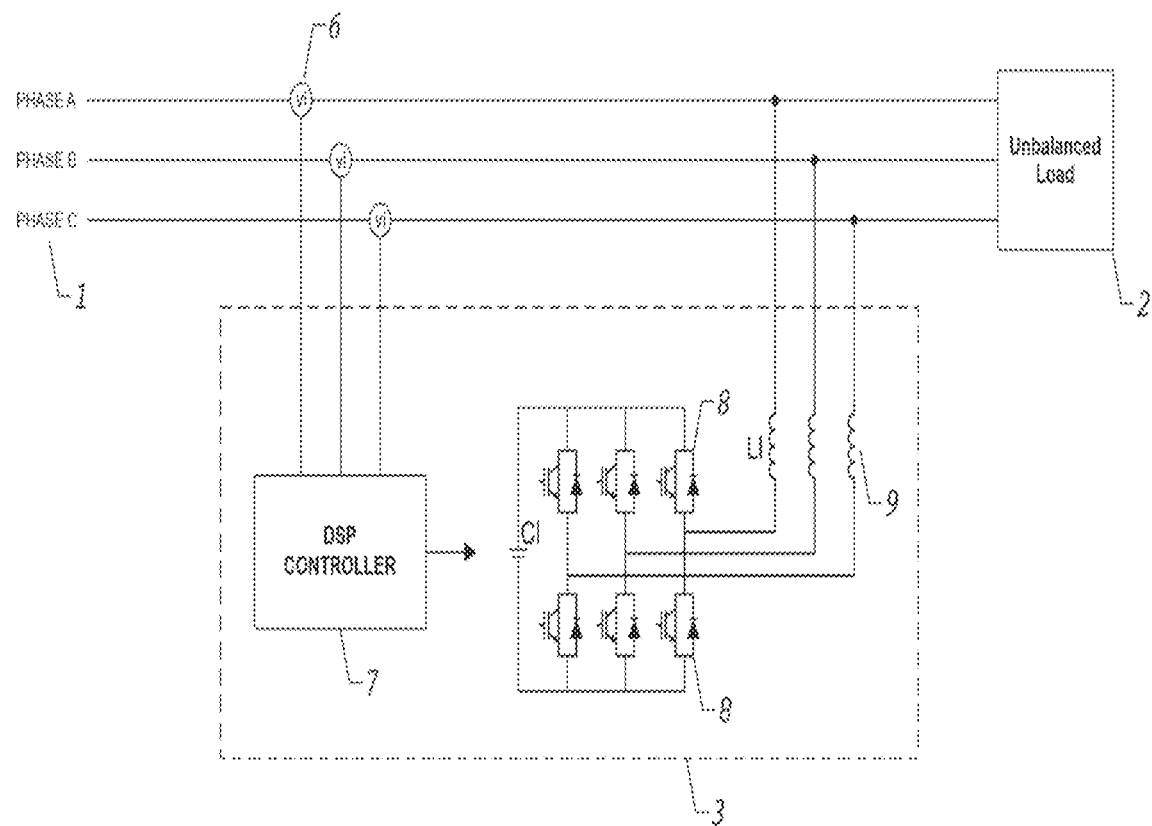
FIG. 3 shows a circuit diagram of a version of a parallel active filter sub-assembly.

Looking now at FIG. 3 where an example of a parallel active filter is shown. The parallel active filter (FAP) 3 (also seen in FIG. 1) is a filter used to attenuate the harmonics present in the electrical network. In this circuit, the inverter injects a current that, added to the load current, causes the cancellation of the harmonics, resulting in the fundamental component. This topology is used to eliminate current and voltage harmonics, reactive compensation, and balancing of load unbalanced current. The parallel active filter 3 (also seen in FIG. 1) uses a voltage source PWM (Pulse Width Modulation) inverter (VSI).

The VSI controller uses voltage and current sensors 6, whose function is to read the current and voltage of the electrical network, including harmonics. A micro-controller DSP processes these signals (Digital Signal Processor) 7, responsible for executing the functions of the VSI, which generates a PWM signal to modulate a voltage wave containing harmonics, where these harmonics have the objective of canceling the harmonics of the electrical network 1. The generation of the sine wave with harmonics takes place through the activation of the IGBTs (Insulated Gate Bipolar Transistors) 8, and to connect to the electrical network, an inductive filter 9 is used. The VSI inverter emits a sinusoidal signal containing harmonics in order to cancel the harmonics present in the electrical network, originated by the load 2. The parallel active filter plays a key role in attenuating these harmonics in the electrical network 1.

Figure 4:
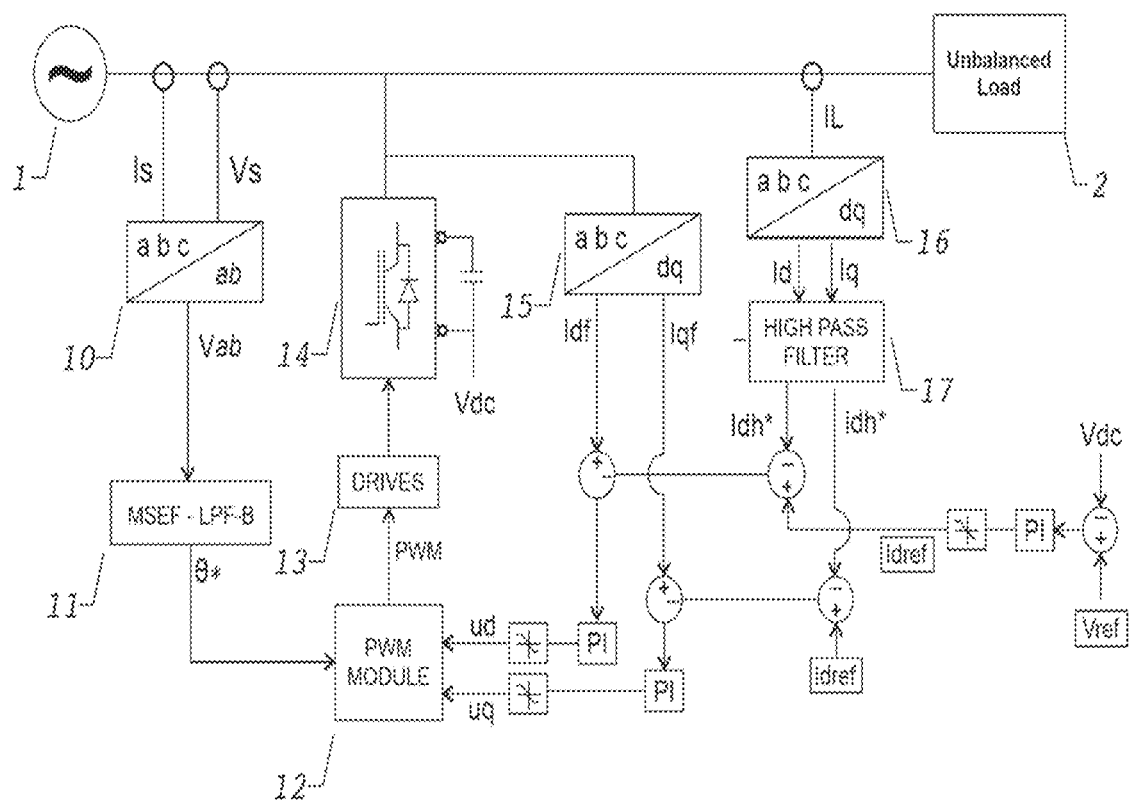
FIG. 4 shows a circuit diagram of a version of a parallel active filter VSI control system sub-assembly.

Looking now at FIG. 4, an example of a parallel active filter VSI control system is demonstrated. In the VSI control of the parallel active filter (FAP) 3 (also seen in FIG. 1), the currents and voltages of the electrical network are read from the input sensor block. In block 10, the three-phase voltage signals are transformed into a two-phase system with stationary axes ($\alpha\beta 0$ transformation). Then, in block 11, the angle $\theta^*$ is obtained, through $\text{sen}(\theta)$ and $\cos(\theta)$, thus enabling the implementation of a routine to obtain the synchronism, to synchronize the PWM converter (Pulse Width Modulation) 12 with the electrical network signal.

The three-phase load currents are read from a second block of sensors. They are transformed from a three-phase system to a two-phase system with stationary axes ($\alpha\beta 0$ transformation) in block 16, and then into a two-phase system with rotating axes dq (transformed from Park).

After passing through a high pass filter 17, reference currents are obtained, represented by $idh^*$ and $iqh^*$ and added to these currents the values of idref and iqref. The result is summed up to the idf and iqf currents, which are the result of subtracting the grid current from the load current. This generates an error applied to the input of two PI (Proportional-Integral) controllers, one for each signal, which are responsible for generating the Ud and Uq signals.

The output signals of PI (Proportional-Integral) controllers are limited within this operating range.

The idref current is the result of the error generated between the DC link voltage of the capacitor (Vdc) and the DC reference voltage (Vref), after passing through a PI controller. With the obtaining of these Ud and Uq signs and the angle θ* calculated from the MSRF-LPF-B synchronization method 11 (Modified Synchronous Reference Frames-Low-Pass Filter Based), the reference signals are generated for the PWM routine 12, which outputs the cycle ratios for each switch 14 of the converter. FIG. 4 shows the parallel active filter control blocks.

The parallel active filter VSI synchronism method is now described. The synchronization system used to synchronize the VSI module with the electrical network 1 (also seen in FIG. 1) is the Modified Synchronous Reference Frames-Low-Pass Filter Based (MSRF-LPF-B) method. In this method, the synchronization angle or the normalized synchronization vector is obtained directly from the network voltages. The method uses low-pass filters to attenuate the harmonic components coming from the network voltages. With the Clarke transform of the input voltages (Vαβ), it is possible to obtain the module, as shown in Equation 1. Then, the values of sine(θ) and cosine(θ) are obtained, as shown in Equation 2. These values are used to synchronize the output variables of the VSI drive.

$$\|V_{\alpha\beta}\| = \sqrt{(V_\alpha^2 + V_\beta^2)} \quad \text{Equation 1}$$

$$\text{sen}(\theta) = \frac{V_\beta}{\|V_{\alpha\beta}\|} \quad \text{Equation 2}$$

$$\cos(\theta) = \frac{V_\alpha}{\|V_{\alpha\beta}\|}$$

Figure 5:
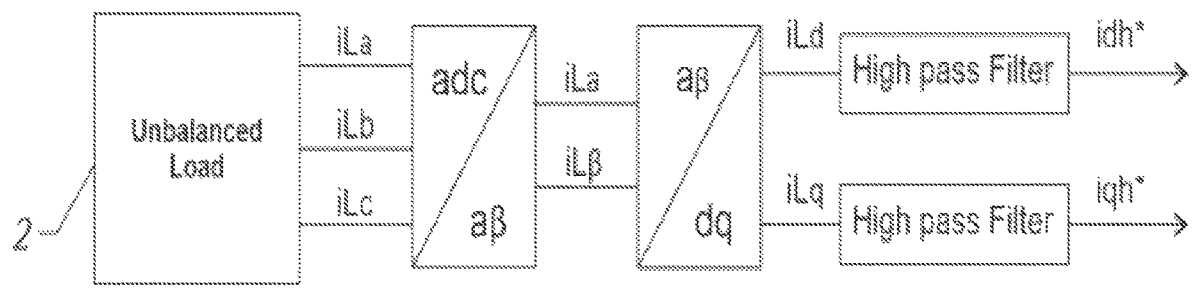
FIG. 5 shows a process diagram of a method for determining the VSI reference current of the parallel active filter.

Looking now to FIG. 5, a process for determination of the VSI reference current of the parallel active filter is shown. The technique used is comprised of, from the reading of the three-phase load currents, transforming the obtained signal into a two-phase system with rotating shafts (Park transform), with the currents in dq format, a filtering of these currents is performed, removing the fundamental component, resulting only in the harmonic currents, represented by idh* and iqh*, which will be the reference currents for the active filter.

A version of the invention can be fairly described as an electronic filter comprised of a parallel passive filter, a parallel active filter and at least one varistor. The filter is installed in parallel to an electrical network. The electrical network supplies at least one unbalanced load. The parallel passive filter is further comprised of one capacitor, a resistor and an inductor. The parallel passive filter is sized to attenuate an unwanted harmonic present in the electrical network, between about 60 Hz to 1140 Hz, where the passive filter diverts the unwanted harmonic from the electrical network. The parallel active filter is further comprised of a pulse width modulation inverter and digital signal processor. The digital signal processor reads a current and voltage on the electrical network and the digital signal processor determines a pulse width modulation signal. The pulse width modulation inverter uses insulated gate bipolar transistors (IGBT) to generate a sinusoidal signal with harmonics. The parallel active filter injects the sinusoidal signal into the electrical network thereby canceling remaining harmonics in the electrical network.

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

I claim:

1. An electrical filter comprised of a parallel passive filter, a parallel active filter and at least one varistor;
    the filter is installed in parallel to an electrical network after consumption meters, wherein the filter is compact and low-cost for installation near unbalanced loads;
    the electrical network supplies at least one unbalanced load;
    the parallel passive filter is further comprised of a capacitor, a resistor and an inductor;
    the parallel passive filter is sized to attenuate an unwanted harmonic present in the electrical network, between about 60 Hz to 1140 Hz, where the passive filter diverts the unwanted harmonic from the electrical network;
    the parallel active filter is further comprised of a pulse width modulation inverter and digital signal processor;
    the digital signal processor reads a current and voltage on the electrical network and the digital signal processor determines a pulse width modulation signal;
    the pulse width modulation inverter uses insulated gate bipolar transistors (IGBT) to generate a sinusoidal signal with harmonics;
    the parallel active filter injects the sinusoidal signal into the electrical network thereby canceling a remaining harmonic in the electrical network;
    wherein the at least one varistor functions as a surge protection device up to 680 Vac; and
    wherein the filter avoids interfering with installed power of the electrical network, selectively cancels impedance between the electrical network and ground for frequencies other than 60 Hz, and stabilizes frequency variations to maintain 60 Hz operation.

2. The electrical filter of claim 1, wherein the filter is installed after consumption meters and connected to a main switch, panels and electrical distribution boards.

3. The electrical filter of claim 1, wherein the parallel active filter and parallel passive filter work together to attenuate voltages and harmonics in the electrical network and reduce total harmonic distortion (THD).

4. The electrical filter of claim 1, wherein the filter is configured for installation close to any unbalanced load to increase efficiency.

* * * * *